(12) United States Patent
Spahlinger et al.

(10) Patent No.: US 7,102,757 B2
(45) Date of Patent: Sep. 5, 2006

(54) CURRENT MEASUREMENT METHOD AND DEVICE BASED ON A FIBER OPTIC IN-LINE SAGNAC INTERFEROMETER

(75) Inventors: Gunter Spahlinger, Stuttgart (DE); Sven Voigt, Freiburg (DE)

(73) Assignee: LITEF GmbH, Freiburg (DE)

( * ) Notice: Subject to any disclaimer, the term of this patent is extended or adjusted under 35 U.S.C. 154(b) by 356 days.

(21) Appl. No.: 10/471,923

(22) PCT Filed: Mar. 15, 2002

(86) PCT No.: PCT/EP02/02906

§ 371 (c)(1),
(2), (4) Date: Sep. 16, 2003

(87) PCT Pub. No.: WO02/075249

PCT Pub. Date: Sep. 26, 2002

(65) Prior Publication Data

US 2004/0095581 A1    May 20, 2004

(30) Foreign Application Priority Data

Mar. 16, 2001  (DE) ................. 101 12 835

(51) Int. Cl.
*G01B 9/02* (2006.01)
(52) U.S. Cl. .................. 356/483; 356/491
(58) Field of Classification Search ........ 356/483, 356/477, 491
See application file for complete search history.

(56) References Cited

U.S. PATENT DOCUMENTS

| | | |
|---|---|---|
| 5,485,274 A | 1/1996 | Kemmler |
| 5,644,397 A | 7/1997 | Blake |
| 6,301,400 B1 | 10/2001 | Sanders |

FOREIGN PATENT DOCUMENTS

| | | |
|---|---|---|
| DE | 19808517 | 9/1999 |
| WO | 9803895 | 1/1998 |

OTHER PUBLICATIONS

J. Blake et al., "In-Line Sagnac Interferometer for Magnetic Field Sensing", *Proc. SPIE*, vol. 2360 (1994), pp. 419-422.

G. Frosio et al., "Reciprocal Reflection Interferometer For a Fiber-Optic Faraday Current Sensor", *Applied Optics/1.*, vol. 33, No. 25 (Sep. 1994), pp. 6111-6122.

S. Short et al., "Elimination of Birefringence Induced Scale Factor Errors in the In-Line Sagnac Sensor", *Journal of Lightwave Technology*, vol. 16, No. 10 (Oct. 1998), pp. 1844-1850.

K. Bohnert et al., "Field Test of Interferometric Optical Fiber High-Voltage and Current Sensors", *Tenth International Conference on Optical Fiber Sensors* (Oct. 11-13, 1994) Glasgow, Scotland/ SPIE-The International Society for Optical Engineering, vol. 2360, pp. 16-19.

K. Bohnert et al., "Field Test of Interferometric Optical Fiber High-Voltage and Current Sensors", *Tenth International Conference on Optical Fiber Sensors* (Oct. 11-13, 1994) Glasgow, Scotland/ SPIE-The International Society for Optical Engineering, vol. 2360, pp. 16-19.

*Primary Examiner*—Hwa (Andrew) Lee
(74) *Attorney, Agent, or Firm*—Elliott N. Kramsky

(57) ABSTRACT

A device for current measurement based on a fiber-optic in-line Sagnac interferometer includes a birefringence phase modulator for non-reciprocal phase modulation of two orthogonal polarization modes of a light beam passing through the interferometer. The phase modulator is a digital phase modulator that is directly digitally drivable to permit simplification of the corresponding signal processing or driving electronics unit.

3 Claims, 3 Drawing Sheets

CURRENT MEASUREMENT METHOD AND DEVICE BASED ON A FIBER OPTIC IN-LINE SAGNAC INTERFEROMETER

BACKGROUND

1. Field of the Invention

The present invention relates to current measurement. More particularly, the invention pertains to a phase modulator and a method for current measurement with a fiber optic in-line Sagnac interferometer.

2. Description of the Prior Art

Optical current measuring devices are increasingly expected to supersede conventional current measuring devices in the future. A known variation of an optical current measuring device provides a physically and technologically elegant solution is based on in-line Sagnac interferometer technology.

A current sensor of this type measures the electric current flowing through a current conductor by the Faraday effect. Such effect relates to rotation of the light oscillation plane of the propagating linearly polarized light parallel to the field lines of a magnetic field. By employing this effect, it is possible to produce a phase shift between two orthogonal polarization modes of a light beam passing through the in-line Sagnac interferometer provided the polarization modes are propagated in an optical measuring coil through which the current conductor passes. The phase shift between the polarization modes that is caused by the electric current is thus a measure of the current intensity. This can be measured by evaluating the pattern produced by interference of the two polarization modes that have been shifted with respect to one another.

A representative current sensor based on the in-line Sagnac interferometer, as described in the article of Blake, Tantaswadi and Carvalho, "In-Line Sagnac-Interferometer For Magnetic Field Sensing", *Proc. SPIE*, vol. 2360 (1994) at pages 419 through 422, and its method of operation are explained below.

FIG. 2 is a schematic block diagram of a current sensor 1 based on an in-line Sagnac interferometer in accordance with the prior art. The current sensor 1 employing an in-line Sagnac interferometer includes a light source 2, a coupler 3, a polarizer 4, a 45 degree splice 5, a birefringence phase modulator 6, a quarter wavelength phase shifter 7, an isotropic fiber coil 8 (current measuring coil), a reflector 9, a current conductor 10, a detector 11, an amplification/evaluation unit 12 and a phase modulator driving unit 13. Light received from the light source 2 via the coupler 3 is polarized by the polarizer 4 and coupled in by means of the splice 5 at 45 degrees with respect to the polarization axes of a polarization-maintaining, birefringent fiber. As a result, two different polarization modes of approximately the same amplitude are guided in parallel through the same fiber. The splitting, customary in a conventional Sagnac interferometer, of a light beam that passes through the interferometer into two component light beams traveling in opposite directions is thus replaced, in an in-line Sagnac interferometer, by "decomposition" of the light beam into two parallel-guided polarization modes (i.e., parallel-guided "component light beams" of a primary light beam with a defined polarization). Each mode, due to the polarization-maintaining fiber, effectively uses a different optical light path. Both polarization modes pass through the birefringent phase modulator 6, preferably a Pockels cell, to produce a non-reciprocal phase shift between the polarization modes, the quarter wavelength phase shifter 7 for converting linearly polarized light into circularly polarized light (for maximum utilization of the Faraday effect) and the isotropic fiber coil 8, through which a current conductor 10 passes, to the reflector 9, which in the event of reflection, rotates the polarization of the impinging polarization modes through 90 degrees and, thus, interchanges the polarizations of the two polarization modes. Should a current flow in the conductor 10, a phase shift will be produced between the two circularly polarized polarization modes as a result of the Faraday effect. Both polarization modes return along the same light path but with different polarizations. The returned polarization modes are combined at the splice 5 and fed, via the polarizer 4 and the coupler 3, to a detector 11 as an interference light beam.

A significant advantage of a conventional Sagnac interferometer modified to form an in-line Sagnac interferometer lies in strictly reciprocal behavior. That is, without a current flow in the conductor 10, the two polarization modes, when coupled out of the polarization-maintaining fiber of the fiber coil 8, experience the same phase shift with respect to one another as they had when coupled into the polarization-maintaining fiber. Phase shifts between the two polarizations that occur as a result of spatial movements of the interferometer, temperature gradients or mechanical stresses in the fiber material, are reciprocal, compensating for one another, due to the parallel guidance of the polarization modes. The only significant effect that causes a non-reciprocal phase shift between the orthogonal polarization modes passing through the interferometer is the Faraday effect.

As mentioned, the birefringence phase modulator 6 enables the imposition of a non-reciprocal phase shift between the polarization modes for shifting an interferometer characteristic curve into a region of very high linearity. The phase modulator 6 includes a polarization-maintaining action (i.e. it does not act in a polarizing manner on the polarization modes). As a consequence, both polarization modes are guided equally but modulated differently in the birefringence phase modulator 6 with use being made of the Pockels effect.

To achieve this, the waveguide in the phase modulator 6 comprises an anisotropic electro-optical crystal so that the Pockels effect becomes direction-dependent and capable of representation as a tensor. The different effects of the electromagnetic field generated by the birefringent phase modulator 6 on the different polarizations are expressed mathematically by the fact that their influences can be described by different tensor elements. The effective refractive index for different polarization modes is changed differently by the electromagnetic field, resulting in a phase shift between the polarization modes.

A birefringence phase modulator with the properties mentioned above can be realized, for example, by a polarization-maintaining fiber wound onto a piezoceramic. A modulation signal is applied to the birefringence phase modulator by the phase modulator driving unit 13. The phase shift between the polarization modes is measured by the detector 11, whose output signal is fed to an amplification/evaluation unit 12.

A further example of a current sensor based on an in-line Sagnac interferometer is described in Frosio and Dänndliker "Reciprocal Reflection Interferometer For a Fiber-Optic Faraday Current Sensor", *Applied Optics* 1, Vol. 33, No. 25 (September 1994). The in-line Sagnac interferometer described therein is quite similar to the design described above. Disturbances due to birefringence in the polarization-maintaining fiber are avoided by means of a light source that emits short-coherent light.

Another current sensor is described in published patent application DE 198 08 517 A1. Such current sensor is based on a conventional Sagnac interferometer. The essential difference from the prior example is that the phase shift is produced between two component light beams traveling in opposite directions that have been generated by beam splitting. As a result, the fiber coil (current measuring coil) is not isotropic, making the current sensor susceptible to disturbance effects due to rotation.

Patent application DE 100 44 197.1 describes a voltage sensor based on an in-line Sagnac interferometer having a design similar to the preceding current sensor. Again, a phase shift is produced between two polarization modes. However, the phase shift is not caused by the Faraday effect, but by means of a voltage provided by an additional phase modulator.

SUMMARY AND OBJECT OF THE INVENTION

It is therefore the object of the present invention to provide apparatus for fiber-optic current measurement of simplified structure and enhanced accuracy.

The foregoing and other objects are addressed by the present invention which provides, in a first aspect, an improvement in a method for measurement of a current by means of an in-line Sagnac interferometer of the type in which a first non-reciprocal phase shift between two orthogonal polarization modes of a light beam passing through the interferometer is produced by the current, the phases of the polarization modes are changed by a second non-reciprocal phase shift in accordance with the Pockels effect to compensate for the first phase shift, thereby determining the first phase shift.

Such improvement is accomplished by providing a plurality of binary-gradated electromagnetic fields. The polarization modes are then passed through the binary-gradated electromagnetic fields to effect the second phase shift so that the second phase shift comprises a shift of a characteristic curve of the interferometer to a region of maximum linearity.

The field strengths of the electromagnetic fields are then varied so that the characteristic curve is shifted independently by ±1.5π or ±0.5π.

In a second aspect, the invention provides an improvement in a closed loop current measurement device of the type that includes a fiber ooptic in-line Sagnac interferometer having a birefringence phase modulator for non-reciprocal phase modulation of an orthogonal pair of polarization modes of a light beam passing therethrough.

The improvement includes the birefringence phase modulator being a digital birefringence modulator. The modulator includes binary-gradated electrodes for compensating a phase shift between the pair of polarization modes in response to the current. The electrodes are driven by a random generator. The random generator is arranged to generate digital modulation signals for statistically independently phase-shifting an interferometer characteristic curve by ±1.5 π or ±0.5 π.

The preceding and other features of the invention will become further apparent from the detailed description that follows. Such description is accompanied by a set of drawing figures. Numerals of the drawing figures, corresponding to those of the written text, point to the features of the invention with like numerals referring to like features throughout.

DETAILED DESCRIPTION OF THE PREFERRED EMBODIMENT

Figure 1:
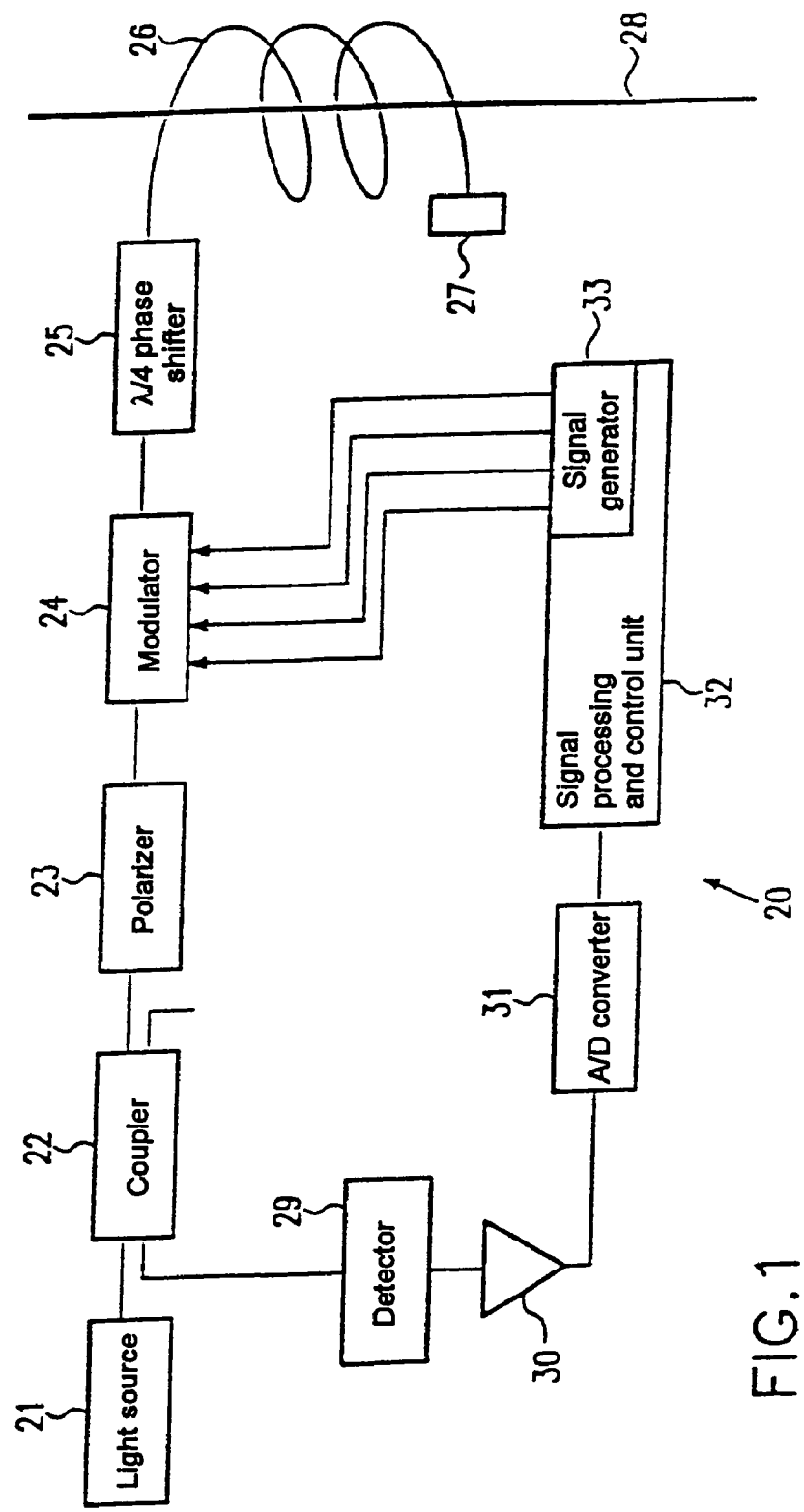
FIG. 1 is a schematic block diagram of a current sensor in accordance with the present invention.
Figure 2:
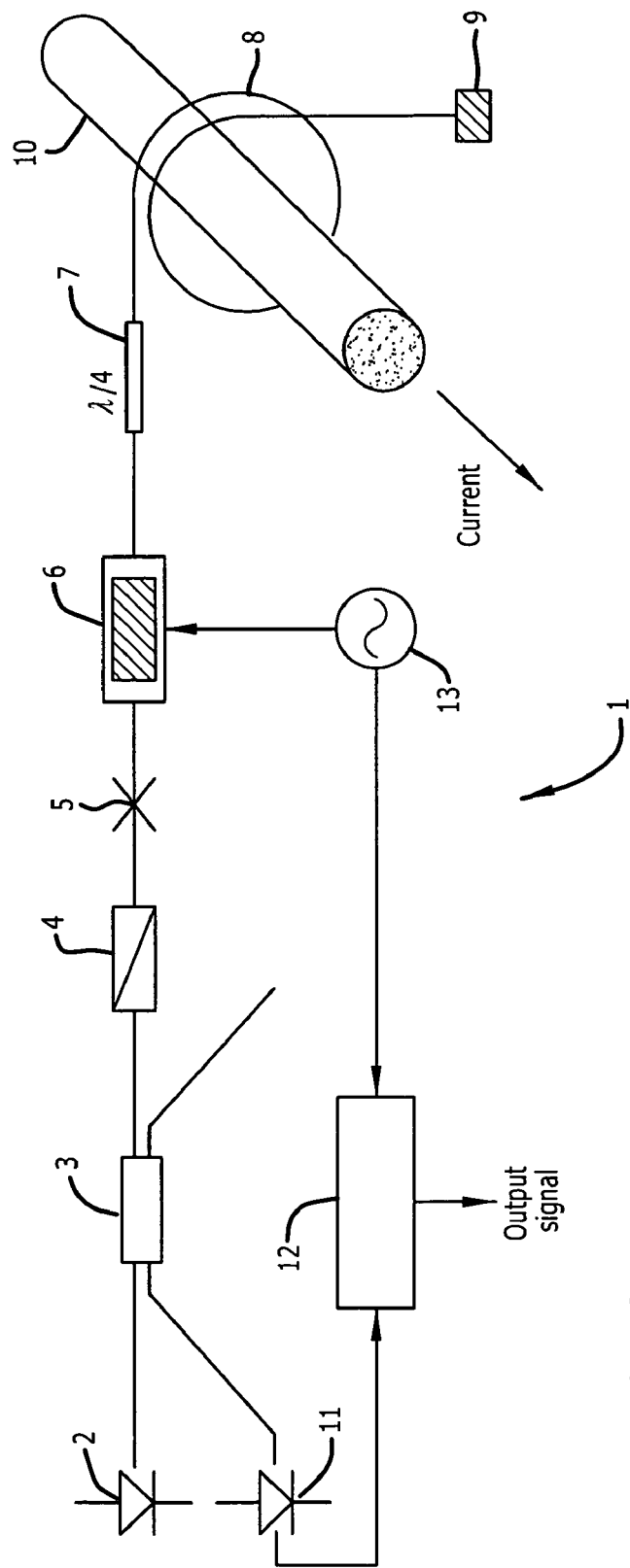
FIG. 2 is a schematic block diagram of a current sensor based on an in-line Sagnac interferometer in accordance with the prior art.

FIG. 1 is a schematic block diagram of a current sensor 20 based on an in-line Sagnac interferometer in accordance with the invention. It includes a light source 21, a coupler 22, a polarizer 23, a birefringence phase modulator 24, a quarter wavelength phase shifter 25, an isotropic fiber coil 26, a reflector 27, a current conductor 28, a detector 29, an amplifier 30, an analog/digital converter 31, a signal processing and control unit 32, and a signal generator unit 33 (integrated into the signal processing and control unit 32). In contrast to the current sensor illustrated in FIG. 2, the phase modulator 24 comprises a digital birefringence phase modulator with binary-gradated electrodes that is preferably driven directly by digital components of the signal processing and control unit 32 of the signal generator unit 33.

Light received from the light source 21 through the coupler 22 is polarized by the polarizer 23 and coupled in at 45 degrees with respect to the polarization axes of a polarization-maintaining, birefringent fiber. In this way, two different polarization modes of approximately equal intensity are guided in parallel within a single fiber. The two polarization modes pass through the phase modulator 24, producing a non-reciprocal phase shift between the polarization modes, the quarter wavelength phase shifter 25 for converting linearly polarized light into circularly polarized light, and the isotropic fiber coil 26 (through which the current conductor 28 passes) to the reflector 27. Upon reflection, the reflector 27 rotates the polarizations of the impinging polarization modes through 90 degrees, thus interchanging their polarizations. Should a current flow through the current conductor 28, a phase shift is produced between the two circularly polarized polarization modes by the Faraday effect. The two polarization modes return along the same light path to interfere in the polarizer 23 and that interference pattern is fed to a detector 29 via the coupler 22. An analog output signal from the detector 29 is increased by the amplifier 30 and fed through the analog/digital converter 31 to the signal processing and control unit 32 that evaluates the digital signal. The signal generator unit 33 generates a digital compensation signal as a function of the digital signal. The digital compensation signal acts directly on the phase modulator to permit the phase shift effected by the current to be measured. The compensation signal is preferably superposed with a signal for stochastically independently shifting the interferometer characteristic curve by ±1.5 or by ±0.5 into the region of very high linearity.

Figure 3:
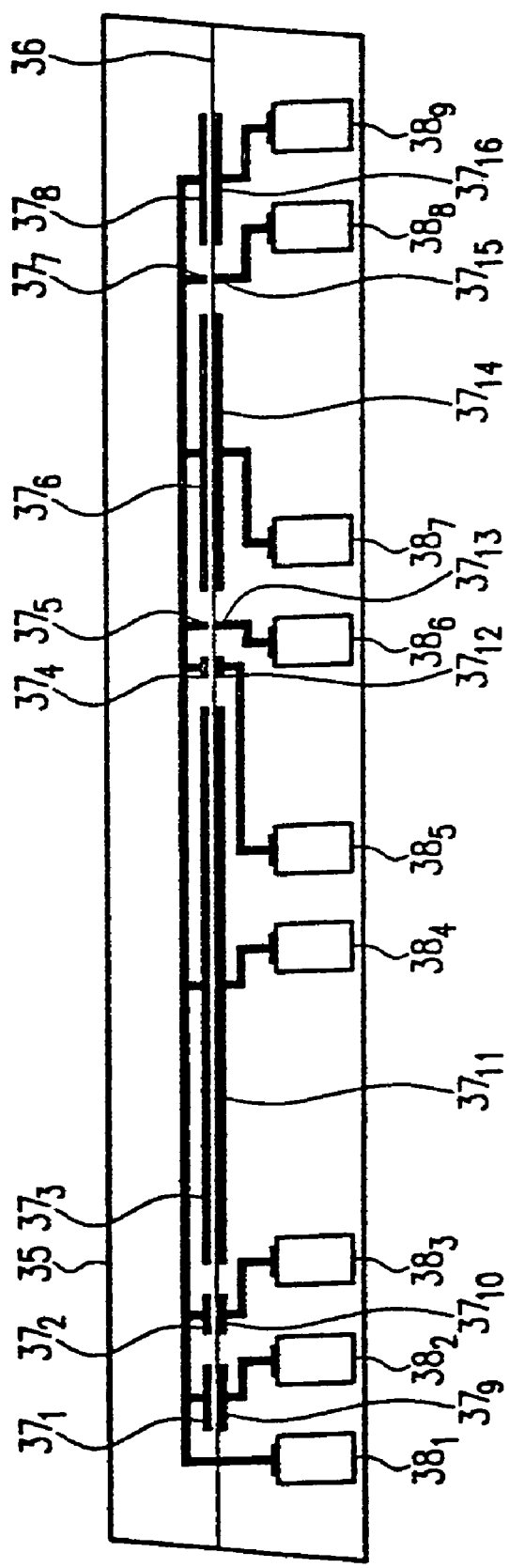
FIG. 3 is a detailed view of a phase modulator in accordance with the present invention.

FIG. 3 is a detailed view of a phase modulator 24 in accordance with the invention. The phase modulator 24 comprises an integrated optical component based on an LiNbO$_3$ crystal 35. A polarization-maintaining waveguide 36 is provided within the LiNbO$_3$ crystal 35 for guiding light. The waveguide 36 is formed from titanium indiffused into the LiNbO$_3$ crystal 35. Electrodes $37_1$ to $37_{16}$, respectively operatively combined to form electrode pairs, are arranged around the waveguide 36.

The waveguide 36 runs between the electrodes 37 to 37$_{16}$ of respective electrode pairs. Respective electromagnetic fields can be applied to each electrode pair via electrode terminals 38$_1$ to 38$_9$ by corresponding (mutually independent) voltages or voltage values applied to the electrode terminals 38$_1$ to 38$_9$. The lengths of the electrode pairs are binary-gradated relative to one another. That is, with the exception of the pair of shortest length, each electrode pair is twice as long as another electrode pair. Alternatively, the electrodes 37$_1$ to 37$_8$ may be combined to form a single electrode whereby the electrodes 37$_9$ to 37$_{16}$ lie opposite the combined electrode. Further possible arrangements of binary-gradated electrodes 37$_1$ to 37$_{16}$ are disclosed, for example, in patent publication WO/9803895.

The electrodes 37$_1$ to 37$_{16}$ are preferably equal distances from the optical axis of the waveguide 36. Should the current to be measured produce a phase shift between orthogonal, circularly polarized polarization modes, such phase shift will be compensated by the phase modulator 24. The phase shift and, thus, the current to be measured, can then be determined from the size of the resetting signal.

Compensation is achieved by applying individual voltages to the electrodes 37$_1$ to 37$_{16}$, shifting the phases of the polarization modes that pass through the fields in accordance with the field strengths and lengths of the generated binary-gradated electromagnetic fields. The field strengths of the applied electromagnetic fields can preferably be changed between a fixed value or zero. It is also possible to permit additional discrete intermediate values of field strength, whereby the resolution of the phase modulation can be further refined. The phase shift can be controlled accordingly by switching the individual electromagnetic fields on and off.

It is thus possible to set the phase shift in "variable" fashion despite discrete field strengths due to the presence of a plurality of electromagnetic fields by applying or switching off corresponding voltages at the individual electrode pairs 37$_1$ to 37$_{16}$ (presupposing that the same voltage that can be applied to the respective electrode pairs 37$_1$ to 37$_{16}$). There exist 256 different possibilities for altering the phase shift between the two component light beams due to the presence of eight electrode pairs 37$_1$ to 37$_{16}$ in the illustrated embodiment. As a result, a targeted phase modulation with fine resolution is possible even in the presence of direct digital driving of the phase modulator 24.

The phase shift is preferably effected by the signal generator unit 33 that is connected to the electrodes 37$_1$ to 37$_{16}$ of the phase modulator 24. The signal generator unit 33 generates digital modulation signals that are applied as voltages to the electrodes 37$_1$ to 37$_{16}$ of the phase modulator. The unit 33 preferably includes a random generator that can be employed to generate the statistically independent modulation signal patterns mentioned above.

If two component light beams with different polarization modes are guided within the waveguide 36, the voltage U$_\pi$ required for generating a phase shift of π between the respective polarization modes is determined by:

$$U_\pi = \frac{\lambda \cdot g}{(n_{TE}^3 r_{33} \Gamma_{TE} - n_{TM}^3 r_{13} \Gamma_{TM})L}$$

where λ is the wavelength of the light wave guided, g designates an electrode gap, $n_{TE,TM}$ designate effective refractive indices for the two polarization modes in the waveguide 3, $r_{13,33}$ are electro-optical tensor coefficients, and $G_{TE,TM}$ is a field overlap between an electric field formed by electrodes 37$_1$ to 37$_{16}$ and an optical field of the component guided light beams. L designates a respective length of the electrodes 37$_1$ to 37$_{16}$.

The invention can also be applied to fiber optic field sensors (e.g. voltage sensors). For example, the phase modulator described in patent application DE 100 44 197.1 for resetting the phase shift affected by a voltage to be measured can be incorporated as a digital birefringence phase shifter with binary-split electrodes.

One essential aspect of the invention is that the phase modulator of the current sensor is a digital birefringence phase modulator. The phase modulator generates a plurality of electromagnetic fields through which pass orthogonal polarization modes of a light beam passing through the interferometer. This gives rise to non-reciprocal phase modulation between the polarization modes due to the Pockels effect.

The use of a digital phase modulator makes it possible to dispense with a digital/analog converter. (This is otherwise necessary when employing an analog phase modulator as a "connecting link" between a digital phase modulator driving device and an analog phase modulator.) As a result, the high power consumption of a digital/analog converter is avoided and existing digital signal processing and control electronics (e.g. a conventional Sagnac interferometer) can be employed without significant modification.

The use of binary-gradated electromagnetic fields and electrodes enables structural simplification of the signal processing and phase modulator control devices of the current sensor as there exists a close correlation between a set of digital modulation signals, capable of interpretation as a binary number and generated in parallel, and the size of the resultant phase shift. Thus, direct application of the digital modulation signal set to the electrodes is expedient.

It is important that the phase shift effected by the current be determined by resetting. The phase modulator thus serves primarily to compensate the phase shift between the orthogonal polarization modes effected by the current (closed-loop system). The measurement of phase shift by compensation makes high measurement accuracy possible and enables the determination of "large" phase shifts without difficulty. It is also advantageous, for increasing measurement accuracy, to use the phase modulator for stochastically independently phase-shifting the characteristic curve of the interferometer by ±1.5 π or by ±0.5 π, whereby the characteristic curve is shifted into a region of maximum linearity.

An integrated optical birefringent waveguide for guiding two orthogonal polarization modes with equal entitlement runs between phase modulator electrodes that are expediently combined to form electrode pairs of binary-gradated lengths (i.e. the lengths of the electrode pairs form a binary sequence). The electrodes are preferably arranged at a constant mutual distance from the optical axis of the waveguide (fabricated, for example, by indiffusion of titanium into an LiNbO$_3$ crystal). The voltages for generating the electromagnetic fields applied to the respective electrode pairs are varied independently of one another ("variation" refers to changeover between discrete values). It is thus possible to affect "separate" phase shifts of the polarization modes passing through the current sensor in each case. The individual electromagnetic fields may be regarded as "basic building blocks" of a "digital" overall electromagnetic field. In comparison with a conventional analog birefringence phase shifter with a single modulation electrode pair, at least one of the modulation electrodes is thus replaced by a plurality of electrodes of preferably binary-gradated lengths. The number of electrode pairs is preferably eight.

The electrodes of binary-gradating lengths may also be arranged such that a plurality of short electrodes are opposite one long electrode. The combination of a long electrode with a short electrode in each case forms an "electrode pair". In this embodiment, the waveguide of the phase modulator runs between the long electrode and the short binary-gradated electrodes.

While this invention has been disclosed with reference to its presently-preferred embodiment, it is not limited thereto. Rather, the invention is limited only insofar as it is defined by the following set of patent claims and includes within its scope all equivalents thereof.

What is claimed is:

1. In a method for measurement of current by means of an in-line Sagnac interferometer of the type in which a first non-reciprocal phase shift between two orthogonal polarization modes of a light beam passing through the interferometer is produced by a current, and the phases of the polarization modes changed by a second non-reciprocal phase shift in accordance with the Pockels effect to compensate for the first phase shift to determine the first phase shift, the improvement comprising the steps of:
   a) providing a plurality of binary-gradated electromagnetic fields; then
   b) passing the polarization modes through said binary-gradated electromagnetic fields to effect said second phase shift so that said second phase shift comprises a shift of a characteristic curve of the interferometer to a region of maximum linearity; and then
   c) varying the field strengths of said electromagnetic fields so that said characteristic curve is shifted independently by $\pm 1.5\ \pi$ or $0.5\ \pi$.

2. A method as defined in claim 1 further including the step of directly generating said electromagnetic fields by means of a plurality of digital voltage signals generated in parallel.

3. In a closed loop current measurement device of the type that includes a fiber optic in-line Sagnac interferometer having a birefringence phase modulator for non-reciprocal phase modulation of an orthogonal pair of polarization modes of a light beam passing therethrough, the improvement comprising, in combination:
   a) said birefringence phase modulator being a digital birefringence modulator;
   b) said modulator including binary-gradated electrodes for compensating a phase shift between said pair of polarization modes in response to a current;
   c) said electrodes being driven by a random generator; and
   d) said random generator being arranged to generate digital modulation signals for statistically independently phase-shifting an interferometer characteristic curve by $\pm 1.5\ \pi$ or $\pm 0.5\ \pi$.

* * * * *